United States Patent
Schemmann et al.

(10) Patent No.: US 7,474,150 B2
(45) Date of Patent: Jan. 6, 2009

(54) AMPLIFIER COMPOSITE TRIPLE BEAT (CTB) REDUCTION BY PHASE FILTERING

(75) Inventors: Marcel F. Schemmann, Echt (NL); Zoran Maricevic, Manlius, NY (US)

(73) Assignee: Broadband Royalty Corporation, Wilmington, DE (US)

( * ) Notice: Subject to any disclaimer, the term of this patent is extended or adjusted under 35 U.S.C. 154(b) by 0 days.

(21) Appl. No.: 10/847,866

(22) Filed: May 19, 2004

(65) Prior Publication Data

US 2004/0213573 A1  Oct. 28, 2004

Related U.S. Application Data

(62) Division of application No. 09/474,295, filed on Dec. 29, 1999, now Pat. No. 6,788,169.

(51) Int. Cl.
*H03F 1/26* (2006.01)
(52) U.S. Cl. ............... 330/149; 330/310; 330/306
(58) Field of Classification Search ............ 333/177, 333/28 R, 138–140; 330/165, 149, 310, 330/306; 725/127, 149
See application file for complete search history.

(56) References Cited

U.S. PATENT DOCUMENTS

| | | | | |
|---|---|---|---|---|
| 2,140,492 A | * | 12/1938 | Black | 330/53 |
| 2,140,915 A | * | 12/1938 | Kreer, Jr. | 330/53 |
| 2,233,061 A | * | 2/1941 | Peterson | 330/52 |
| 3,567,872 A | * | 3/1971 | Narayanan | 370/492 |
| 3,621,480 A | * | 11/1971 | Brownlie | 333/28 R |
| 3,755,737 A | | 8/1973 | Eller | |
| 3,879,689 A | * | 4/1975 | Seidel | 333/138 |
| 3,938,056 A | | 2/1976 | Pond | |
| 4,276,514 A | | 6/1981 | Huang | |
| 4,461,032 A | * | 7/1984 | Skerlos | 725/25 |

(Continued)

FOREIGN PATENT DOCUMENTS

FR  2332650 A  *  7/1977

(Continued)

OTHER PUBLICATIONS

Horowitz, P. and W. Hill. The Art of Electronics. New York: Cambridge University Press, 1980.*

(Continued)

*Primary Examiner*—Patricia Nguyen
(74) *Attorney, Agent, or Firm*—FSP LLC

(57) ABSTRACT

In a broadband communication system there are multi-stage power amplifier systems for amplifying the power of radio-frequency (RF) communication signals. Each stage of the amplifier system results in composite triple beat (CTB) distortion, and if the phase of the CTB distortions are approximately the same (i.e. are in-phase), then the amplitudes of the distortions are added (i.e. "20 dB" rule). The amplifier system of the invention includes one or more phase filters positioned in series between the power amplifier stages. The phase filters are adapted to shift the phase of the communication signals, so that the phase of CTB distortions, resulting from the amplification of the communication signals in the amplifier stages between the phase filters, are substantially different (i.e. are out-of-phase). Thus, only the power of the CTB distortions are added (i.e. "10 dB" rule).

4 Claims, 7 Drawing Sheets

U.S. PATENT DOCUMENTS

| | | | |
|---|---|---|---|
| 4,885,562 A | | 12/1989 | Ouvrard et al. |
| 4,947,386 A | | 8/1990 | Preschutti |
| 4,978,931 A | * | 12/1990 | Carp et al. ............... 333/28 R |
| 5,109,286 A | | 4/1992 | West, Jr. et al. |
| 5,172,068 A | | 12/1992 | Childs |
| 5,280,346 A | | 1/1994 | Ross |
| 5,343,158 A | | 8/1994 | Gris et al. |
| 5,430,568 A | | 7/1995 | Little et al. |
| 5,488,413 A | | 1/1996 | Elder et al. |
| 5,519,434 A | | 5/1996 | Fasquel |
| 5,706,111 A | | 1/1998 | Morales et al. |
| 5,742,205 A | * | 4/1998 | Cowen et al. ............... 330/269 |
| 5,765,097 A | | 6/1998 | Dail |
| 5,822,102 A | | 10/1998 | Bodeep et al. |
| 5,864,672 A | | 1/1999 | Bodeep et al. |
| 5,966,049 A | | 10/1999 | Yuen et al. |
| 6,160,452 A | | 12/2000 | Daughtry et al. |
| 6,433,642 B1 | * | 8/2002 | Goyette ............... 330/304 |
| 6,476,685 B1 | | 11/2002 | Cheung |

FOREIGN PATENT DOCUMENTS

| | | | |
|---|---|---|---|
| GB | 2007930 A | * | 5/1979 |
| JP | 52047355 A | * | 4/1977 |
| JP | 4-249478 A | | 9/1992 |
| JP | 7-66657 A | | 3/1995 |

OTHER PUBLICATIONS

A. N. Smantser, "Influence of Parasitics on the Group Delay Equalizer in a radio Relay Link IF Amplifier", Telecommunications and radio Engineering, vol. 25, No. 1, 1971, pp. 34-41, XP002168235.

Huttle, William, "Cable Modems and Hybrid Filer Coax Systems." Naval Surface Warfare Center, Dahlgren Division, Code B32, Jul. 1998, pp. 1-8, http://216.239.39.100/search?q=cache:OpRaQ-n-Ho4C:www.nswc.navy.mil/cosip/aug98/osa0898-1.shtml.

Iannone et al., "High-speed point-to-point and multiple broadcast services delivered over a WDM passive optical network." IEEE Photonics Technology Letters, vol. 10, No. 9, Sep. 1998, pp. 1328-1330.

Smantser, A.N., "Graphical Design of a Single-Section Equalizer for the Group delay response of an IF Channel." Telecommunications and radio engineering, vol. 24, No. 7, 1970, pp. 6-12.

* cited by examiner

AMPLIFIER COMPOSITE TRIPLE BEAT (CTB) REDUCTION BY PHASE FILTERING

CROSS REFERENCE TO RELATED APPLICATION

The present application claims the benefit under 35 USC 120 as a divisional application of utility application Ser. No. 09/474,295, filed Dec. 29, 1999, and now granted as U.S. Pat. No. 6,788,169 B1. the disclosure of which is herein incorporated by reference.

FIELD OF THE INVENTION

The invention is related to the field of cable television systems and more specifically with amplification of multi-carrier video signals in cable television systems.

BACKGROUND OF THE INVENTION

In a cable television system (CATV), television programs are provided at a central head-end. The programs are distributed from the head-end through branching tree-like networks of optical fibers to a multitude of hybrid fiber cable nodes (HFCNs) in respective local communities. Then further distributed from the HFCNs through branching tree-like networks of coaxial cables to customer interface units (CIUs), also called cable terminations.

Currently, many of these systems are beginning to provide additional communication services such as telephone services and computer networking services (e.g. internet connection) through the cable television system. Telephone and computer networking services require bi-directional communication in the cable television system. Forward data signals for these additional services are transmitted in a manner similar to television signals, as described above, and return data signals are transmitted through the same path in the reverse direction. That is, return signals are collected from the CIUs through the branching coaxial cable networks to the HFCNs, back through the HFCNs, and back through the branching optical fiber network to the head-end.

At the head-end, a multitude of electronic forward information signals for broadcast television and additional services (telephone and computer communications) are used to modulate respective carrier signals of different frequencies. The modulated carrier signals are combined into an electronic multi-carrier forward signal that is used to modulate a forward laser beam to produce an optical forward signal carried by the forward laser beam. The modulated laser beam, carrying the optical forward signal, is transmitted through the optical fiber network to a multitude of the HFCNs. At each local node an optical detector coverts the optical forward signal back into an electronic forward signal. The reconverted electronic forward signal is transmitted from the HFCNs through the coaxial cable network to CIUs at homes and businesses of customers.

At the cable termination, telephone and computer equipment of the customer, are connected to the CIUs. The customer's equipment produce electronic return signals that are transmitted by the CIUs into the coaxial cable network. The return signals are multi-carrier modulated signals similar to the forward signals. The return signals travel back through the tree-like coaxial cable network to the HFCNs. In the HFCNs, the return signals are separated from the forward signals by diplex filters. The separated return signals are used to modulate a return laser beam to produce a multi-carrier optical return signal carried by the return laser beam. The optical return signal is transmitted back through the tree-like optical fiber network to the head-end where the optical return signals are converted back into electronic return signals by an optical detector for the return signals. The electronic return signals are demodulated and used for telephone and computer communications.

Requirements for signal to noise ratio (S/N) at the cable termination together with limits on the allowed optical power, limit the length of one-directional optical transmission of analog television signal to around 100 km. In the coaxial cable network, line amplifiers are required at intervals of approximately 300 to 350 meters in order to maintain the amplitude of the high frequency electronic signals. The line amplifiers in the coaxial cable network produce distortions that result in additional noise that further limits the length of signal transmission.

In bi-directional transmission, the introduction of return light beams in the optical fiber network results in crosstalk as additional noise that further reduces the range of cable broadcasting. The line amplifiers must be bi-directional and both the forward and return amplifiers produce distortions that result in increased noise in both the forward and return directions which further limits transmission distance.

An important part of the distortion caused by power amplifiers is the composite triple beat (third order) distortion. In addition to the two amplifiers in each bi-directional line amplifier, the optical transmitters, optical receivers, and CIUs each include a power amplifier. The distortions are cumulative as the signal passes through a multitude of power amplifiers from the source of the signal to the CIUs, and the distortions from return signal amplification in the line amplifiers also adds to the distortion of the forward signals. The result is that signal transmission in bi-directional systems is even more limited by noise than in previous one-directional systems.

Those skilled in the art are directed to the following citations. U.S. Pat. No. 4,947,386 to Preschutti discloses a broadband network with a bi-directional amplifier. U.S. Pat. No. 5,343,158 to Gris discloses another bi-directional amplifier. U.S. Pat. No. 5,519,434 in FIG. 2 discloses an all pass filter.

The above references are hereby incorporated herein in whole by reference.

SUMMARY OF THE INVENTION

A broadband communication system includes multi-stage power amplifier systems for amplifying the power of radio-frequency (RF) communication signals. Each stage of the amplifier systems result in composite triple beat (CTB) distortion, and if the phase of the CTB distortions are approximately the same (i.e. are in-phase), then the amplitudes of the distortions are added (i.e. "20 dB" rule). The amplifier system of the invention includes one or more phase filters positioned in series between the power amplifier stages. The phase filters are adapted to shift the phase of the communication signals, so that, the phase of CTB distortions, resulting from the amplification of the communication signals in the amplifier stages between the phase filters, are substantially different (i.e. out-of-phase). Thus, only the power of the CTB distortions are added (i.e. "10 dB" rule).

Preferably, the shift in-phase response of the phase filters, over the frequency band to be amplified by the power amplifier, is at least 30 degrees over at least 15% of the band. Preferably, the multi-stage power amplifier is provided as an amplifier unit on a plug-in card to allow the invention to be easily implemented on existing equipment such as line amplifiers.

The invention includes a particular phase filter that allows the phase of a communication signal to be reliably shifted by amounts controlled by selecting the properties of the components of the phase filter.

The invention also includes a bi-directional line amplifier that uses the multi-stage phase shifted power amplifier of the invention. The invention is especially useful for such line amplifiers because several such amplifiers are often required in series along the coaxial cable networks of a broadband network system. It is an important aspect of the invention that phase filters be used to prevent the amplitudes of CTB distortions of the series of line amplifiers from being combined additively.

The invention also includes an optical transmitter using the multi-stage phase shifted power amplifier of the invention. The power amplifier is required to provide the correct power for modulating the laser beam. These optical transmitters are used in the cable television system to transmit the communication signals through optical fibers in a forward direction from the head-end through hybrid fiber cable nodes (HFCNs) and to transmit return signals back through the optical fibers from the HFCNs to the head-end. The CTB distortion resulting from the power amplification in the optical transmitters accumulates with the CTB distortions of the line amplifiers to produce noise in the system.

The invention also includes an optical receiver using the multi-stage phase shifted power amplifier of the invention. These receivers usually include a preamplifier to amplify the signal for post-processing the signal and after post-processing the signal is amplified for further distribution. These optical receivers are used to receive the forward communication signals from the optical fibers at the HFCNs and provide the amplified signal into the coaxial cable networks. Also, these optical receivers are used to receive the return communication signals from the optical fibers at the head-end. The CTB distortion resulting from the power amplification in the optical receivers accumulates with the CTB distortions of the line amplifiers and power amplifiers in the optical transmitters to produce noise in the system.

The invention also includes the head-end, an optical hub, and HFCNs that use the transmitters and receivers of the invention that utilize the multi-stage phase shifted power amplifier of the invention.

The invention reduces the accumulated amplitude of the different CTB distortions produced by power amplifiers in several different types of equipment in the communications link of a cable television system. Both, the CTB distortions in the forward signal between the head-end and the CIUs are reduced and the CTB distortions in the return signals from the CIUs to the head-end are reduced.

Those skilled in the art will understand the invention and additional objects and advantages of the invention by studying the description of preferred embodiments below with reference to the following drawings that illustrate the features of the appended claims:

DETAILED DESCRIPTION OF PREFERRED EMBODIMENTS

In the following description the same labels in different figures indicate similar elements, but similar elements may be identified by different labels for convenience of description.

Figure 1:
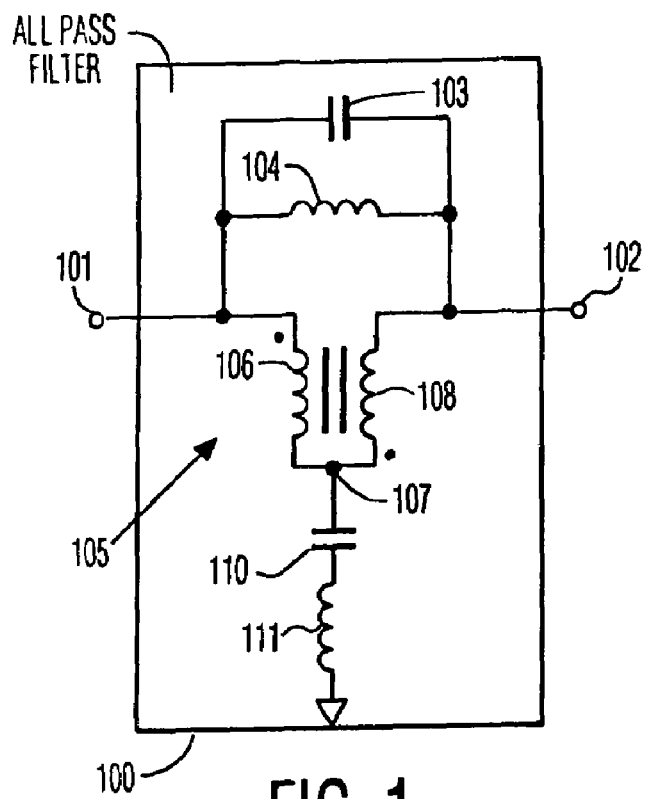
FIG. 1 illustrates an all pass filter of the invention.

FIG. 1 illustrates an all pass filter 100 of the invention. The all pass filter includes: an input terminal 101 and an output terminal 102; a capacitor 103 connected between the input and output terminals; an inductor 104 connected between the input and output terminals; a transformer 105 with first windings 106 connected in a direction between the first terminal and a third terminal 107 and the second windings 108 connected in the same direction between the third terminal and the output terminal, the first windings 106 and the second windings 108 being connected in series; and a capacitor 110 and an inductor 111 connected in series between the third terminal and ground. The order of the connection of capacitor 110 and inductor 111 is arbitrary. The location of the dots on transformer 105 indicate that the direction of winding 108 is actually opposite to the way it is shown. This notation is customarily used in the art to simplify schematic representations.

The particular all pass filter 100 is especially useful for changing the phase of a multi-carrier electronic signal with a range of carrier frequencies of approximately 5-50 MHz or approximately 50-550 MHz. Preferably, the properties of the capacitors, inductors and transformer are selected so that, the phase of the multi-carrier signal at the output terminal is shifted at least 15 degrees with respect to the phase at the multi-carrier signal at the input terminal.

Figure 2:
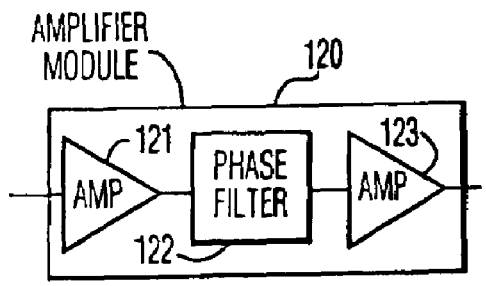
FIG. 2 shows an amplifier module of the invention using a phase filter.

FIG. 2 shows an amplifier module 120 of the invention includes: a first amplifier stage 121 of one or more amplifiers for amplifying a first signal to produce a second signal; a first phase filter 122 for changing the phase of the second signal to produce a third signal; and a second amplifier stage 123 of one or more amplifiers for amplifying the third signal to produce a fourth signal. The phase filter alters the phase of the multi-carrier signal, so that, the amplitude of composite triple beat (CTB) distortion produced by the first amplifier stage is not directly added to the amplitude of the CTB distortion produced by the second amplifier stage.

If the CTB distortion produced by the second amplifier stage has the same phase as the CTB distortion produced by the first amplifier stage, then the amplitudes of the two CTB distortions are directly added resulting in a larger CTB distortion. This is the so called 20 dB rule. In communication systems, the CTB distortion results in noise in the system and needs to be minimized. Generally, the amplifier stages change the phase slightly, so that, there will be some small phase difference between the two CTB distortions which slightly reduced the total CTB distortion.

If the phase of the CTB distortion produced by the second amplifier was exactly 180 degrees different from the phase of the CTB distortion produced by the first amplifier stage (e.g. they were out-of-phase) and the CTB distortions were identical then these two CTB distortions would cancel out and there would be no total CTB. However, the change in-phase produced by a phase filter is dependent on frequency so that the CTBs can not be made 180 degrees out-of-phase over the whole frequency range. Also, the CTB distortion produced by the amplifiers will be different even if the amplifiers stages are identical, which they generally are not, because the input power levels are different because the input signal to the second amplifier has already been amplified. Also, the CTB distortion generally depends on the amplitude of the input signal which changes during communication. If there are more than two amplifier stages, attempting to cancel out CTB distortions becomes even more problematical. Preferably, the phase shift due to the phase filter is in the opposite direction to the phase shift produced by the first amplifier stage, but is preferably much larger than the phase shift typically produced by amplifiers that are used in broadband networks.

The purpose of the phase shift is not to compensate for the phase shift due to the amplifier stages, but to provide an even greater phase shift so that the CTB distortions are at least partially out-of-phase so that noise due to distortion is reduced.

Preferably, the phase filter of FIG. 2 changes the phase of the output signal of the first amplifier stage so that, the total CTB distortion is reduced in relation to a similar system of amplifier stages without the phase filter. Preferably, the phase of the input signal of the second stage is at least 30 degrees for at least 15% of the frequency band of the multi-carrier signal and more preferably at least 60 degrees different than the phase of the input signal of the first amplifier stage. Even more preferably, the phase of the input signal to the second stage is at least 90 degrees and even more preferably approximately 180 degrees out-of-phase with the input to the first amplifier stage. In this case, the total CTB distortion resulting from the amplifier module will be substantially less than the total of the amplitudes of the CTBs produced by each of the amplifier stages.

Figure 3:
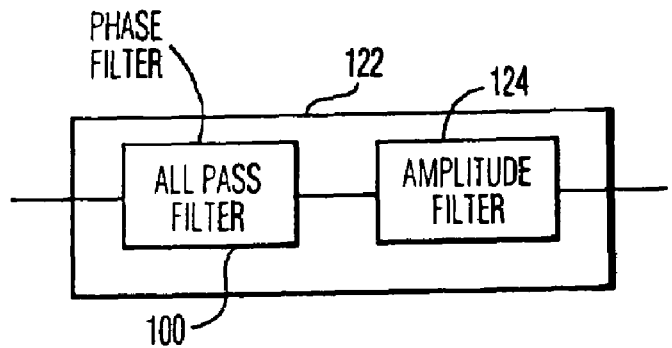
FIG. 3 illustrates details of the phase filter of FIG. 2 including the all pass filter of FIG. 1.

FIG. 3 illustrates the phase filter 122 of FIG. 2 and includes: an all pass filter 100 of FIG. 1; and an amplitude filter 124. All pass filters and amplitude filters are well known in the art. The all pass filter of FIG. 3 may be any known all pass filter capable of changing the phase of the carrier signals of a multi-carrier broadband signal by at least approximately 30 degrees over at least approximately 15% of the band, but is preferably, the all pass filter of FIG. 1. Preferably, the all pass filter and amplitude filter are combined into a single circuit providing both these functions.

Figure 4:
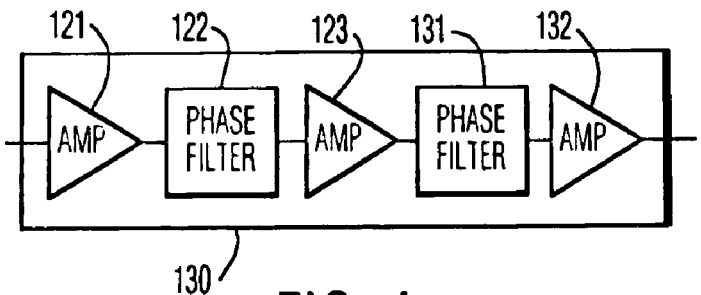
FIG. 4 shows another embodiment of the amplifier module of the invention.

FIG. 4 shows an amplifier module 130 of the invention which is similar to the amplifier module of FIG. 2, but further includes: a second phase filter 131 for changing the phase of the fourth signal to produce a fifth signal; and a third amplifier stage 132 of one or more amplifiers for amplifying the fifth signal to produce a sixth signal. The second phase filter is similar to the first phase filter, but preferably shifts the phase by approximately twice as much and in the opposite direction, so that, the phases of the inputs of the amplifier stages differ by at least approximately 30 degrees from the phase at either of the other two inputs. In this embodiment the phase of the input signal to each amplifier stage is preferably at least approximately 30 degrees different than the phase of the input signal of any other amplifier stage, and more preferably, the phases are different by at least approximately 60 degrees and less than approximately 120 degrees.

Figure 5:
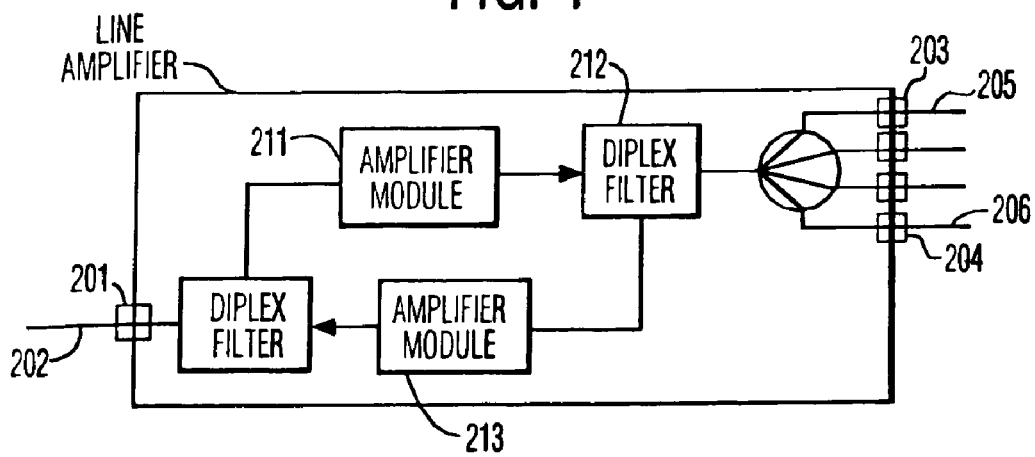
FIG. 5 illustrates portions of a bi-directional line amplifier of the invention.

FIG. 5 illustrates portions of a bi-directional line amplifier 200 of the invention using the amplifier module of FIG. 2. The bi-directional amplifier includes: a connector 201 for a first coaxial cable 202; connectors 203-204 respective second coaxial cables 205-206; a first diplex filter 210 for separating higher-frequency signals from the signals in the first coaxial cable; a first amplifier module 211 for amplifying the separated higher-frequency signals as an input signal and transmitting the amplified higher-frequency signal into the second coaxial cables as an output signal; a second diplex filter 212 for separating lower-frequency signals from the signals in the second coaxial cables; a second amplifier module 213 for amplifying the separated lower-frequency signals as an input signal and transmitting the amplified lower-frequency signals into the first coaxial cable as an output signal. The line amplifier further includes a splitter for providing copies of the amplified higher-frequency signals into each of the second coaxial cables 205-206 and providing respective lower-frequency signals from each of the second coaxial cables to the second diplex filter 212.

At least one of the amplifier modules is an amplifier module similar to amplifier module 120 of FIG. 2, and more preferably, both amplifier modules are modules similar to the module of FIG. 2. The above discussion of amplifier module also generally applies to these amplifier modules. The components of the all pass filters of amplifier module 211 are selected to produce a phase difference of at least 30 degrees over 15% of a frequency band of 50-550 MHz or 65-550 MHz, and the components of the all pass filters of amplifier module 213 are selected to produce a phase difference of at least 30 degrees over 15% of a frequency band of 5-50 MHz or 5-65 MHz.

Figure 6:
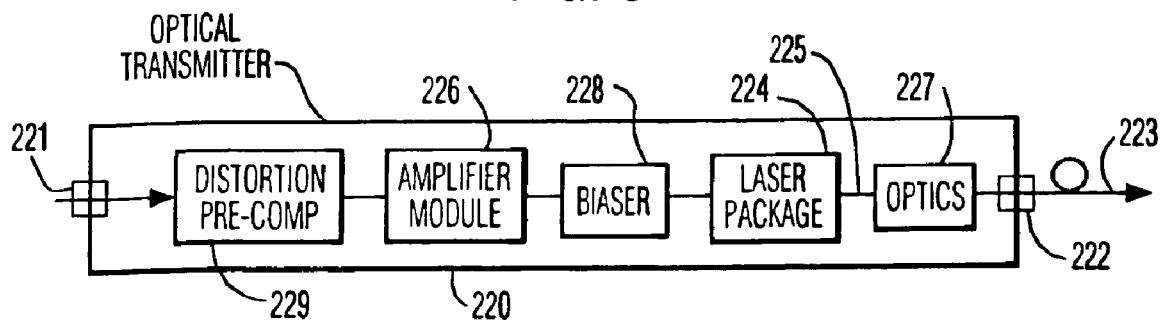
FIG. 6 show portions of an optical transmitter of the invention.

FIG. 6 show portions of an optical transmitter 220 of the invention which, includes: an input connection 221 for an electronic signal; an output connection 222 for an optical path (such as optical fiber 223); a laser package 224 for producing a modulated laser beam 225; an amplifier module 226 for amplifying the electronic signal to produce an amplified electronic signal directed to the laser package; and an optics system 227 for directing the modulated laser beam into the optical fiber. The laser package may be either: a continuous laser and an external modulator; or a DFB laser. If the laser package is a DFB laser then a biaser 228 is required for biasing the amplified electronic signal for use as the bias current of the DFB laser.

The transmitter further includes a distortion pre-compensator 229 for distorting the electronic signal to compensate for at least a portion of the CTB produced in the amplifier module. The pre-compensator may also compensate for composite second order (CSO) distortions caused by the amplifier modules along with CTB and CSO distortions due to the laser modulation, and transmission of the optical signal through optical fiber that is does not exhibit zero dispersion at the laser wavelength. The pre-compensator may also shape the signal so that larger excursions are reduced to prevent large negative excursions in the signal from going below a laser cut-off current and large positive excursions causing increased distortions.

Amplifier module 226 is similar to amplifier module 120 of FIG. 2 and the above discussion of amplifier module 120 also generally applies to amplifier module 226. The components of the all pass filter of amplifier module 226 are selected to produce a phase difference of at least 30 degrees over at least 15% of the frequency band of the electronic signal.

Figure 7:
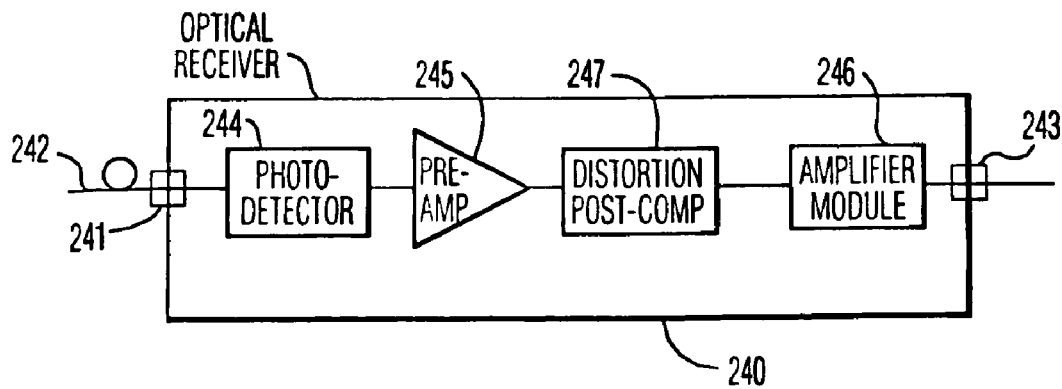
FIG. 7 illustrates portions of an optical receiver of the invention.

FIG. 7 illustrates portions of an optical receiver 240 of the invention which includes: a connector 241 for an optical path (e.g. optical fiber 242); an output terminal 243 for an electrical path; a photo-detector 244 for converting an optical signal in the optical fiber into an electronic signal; a preamplifier 245 for amplifying the electronic signal to produce a preamplified signal; and an amplifier module 246 for amplifying the preamplifier signal to produce an amplified signal at the output terminal. The optical receiver also includes a distortion post-compensator 247 for compensating for at least a portion of CTB distortion produced by amplifier module 246. The post-compensator may also compensate for composite second order (CSO) distortions caused by the amplifier module along with CTB and CSO distortions due to laser modulation and transmission of the optical signal through optical fiber that is does not exhibit zero dispersion at the laser wavelength. Preferably, the bandwidth of digital signals is less than an octave and the post-compensator includes a filter for filtering out essentially all the CSO distortions. More preferably, the bandwidth of digital signals is less than half an octave and the filter of the post-compensator also filters out essentially all the fourth order distortions. If a pre-compensator included signal shaping, then preferably, the post-compensator also includes signal shaping to restore the signal to its original shape before signal shaping in the transmitter.

Amplifier module 246 is similar to amplifier module 120 of FIG. 2 and the above discussion of amplifier module 120 also generally applies to amplifier module 246. The components of the all pass filter of amplifier 246 are selected to produce a phase difference of at least 30 degrees over at least 15% of the frequency band of the electronic signal.

Figure 8:
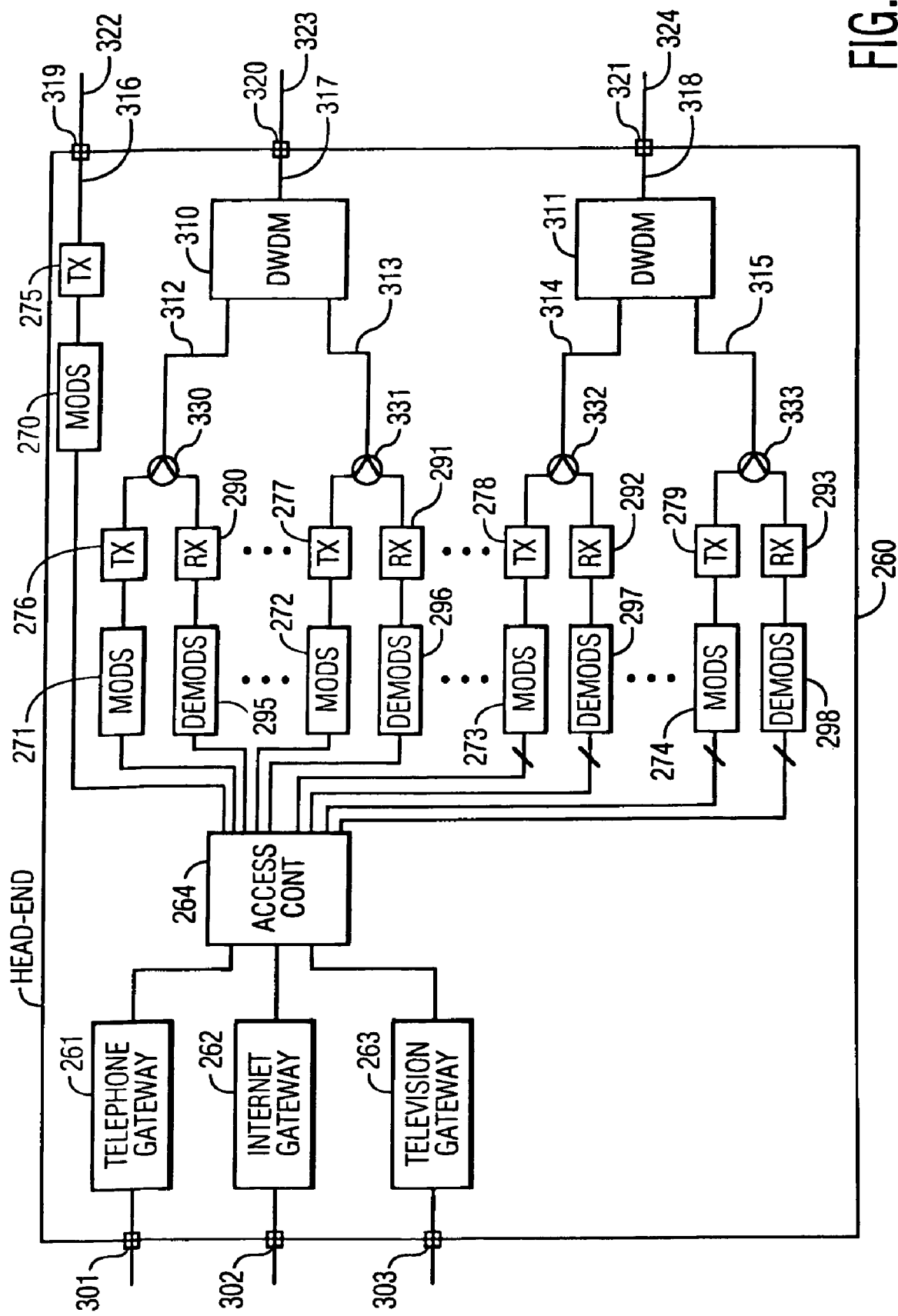
FIG. 8 shows portions of a specific embodiment of a head-end of the invention.

FIG. 8 shows portions of a specific embodiment of a head-end 260 of the invention, which includes: gateway apparatus 261-263 for providing electronic base-band forward signals and for receiving electronic base-band return signals; an access controller 264 for controlling the routing of the electronic base-band forward and return signals between the gateway apparatus and other portions of the head-end; one or more modulators 270-274 for modulating radio-frequency carrier signals with the electronic base-band forward signals to produce multi-carrier electronic forward signals; respective optical transmitters 275-279 for converting the multi-carrier electronic forward signals into multi-carrier optical forward signals in respective optical paths, the optical signal's having optical wavelengths, the wavelengths of the optical signals from some transmitters being different from the wavelengths of optical signals from other transmitters; one or more optical receivers 290-293 for converting multi-carrier optical return signals in respective optical paths into the multi-carrier electronic return signals; and respective demodulators 295-298 for demodulating the multi-carrier electronic return signals to produce the electronic base-band return signals. The gateway apparatus includes a telephone gateway 261 with connection 301 for bi-directional telephone communication with a telephone network; an internet gateway 262 with connection 302 for bi-directional computer communication with a computer network; and a television gateway 263 with connection 303 for bi-directional video communication with a television network.

The head-end further includes one or more dense wavelength division multiplexers 310-311. Each multiplexer, such as multiplexer 310, combines multi-carrier optical forward signals from multiple optical paths 312-313 with different respective optical wavelengths into a single common optical path 317 and separates multiple multi-carrier optical return signals with different respective optical wavelengths from the single common optical path into the multiple respective optical paths. Connectors 319-321 connect respective optical paths 316-318 with respective optical fibers 322-324.

The head-end further includes one or more optical splitters 330-333 for connecting respective optical transmitters 276-279 and respective optical receivers 290-293 to the same end of respective optical paths 312-315, so that, the respective transmitter can transmit the optical forward signal with approximately the same optical wavelength as the optical wavelength of the optical return signal received by the respective optical receiver. The optical forward signals include one or more analog television signals with carrier frequencies of approximately 50-550 MHz or 65-550 MHz transmitted through optical fiber 322. Forward digital signals, transmitted to optical hubs discussed below, have carrier frequency bands of approximately 550-840 MHz and potentially in the future 840-1260 MHz. Return digital signals from optical hubs have carrier frequency bands of 400-600 MHz and 600-900 MHz and potentially in the future of 900-1350 MHz.

The transmitters 275-279 of the head-end are similar to the transmitter 220 of FIG. 6, and the receivers 290-293 of the head-end are similar to the receiver 240 of FIG. 7. Thus, each transmitter and receiver includes an amplifier module similar to the amplifier module 120 of FIG. 2 which includes the all pass filter 100 of FIG. 1.

Figure 9:
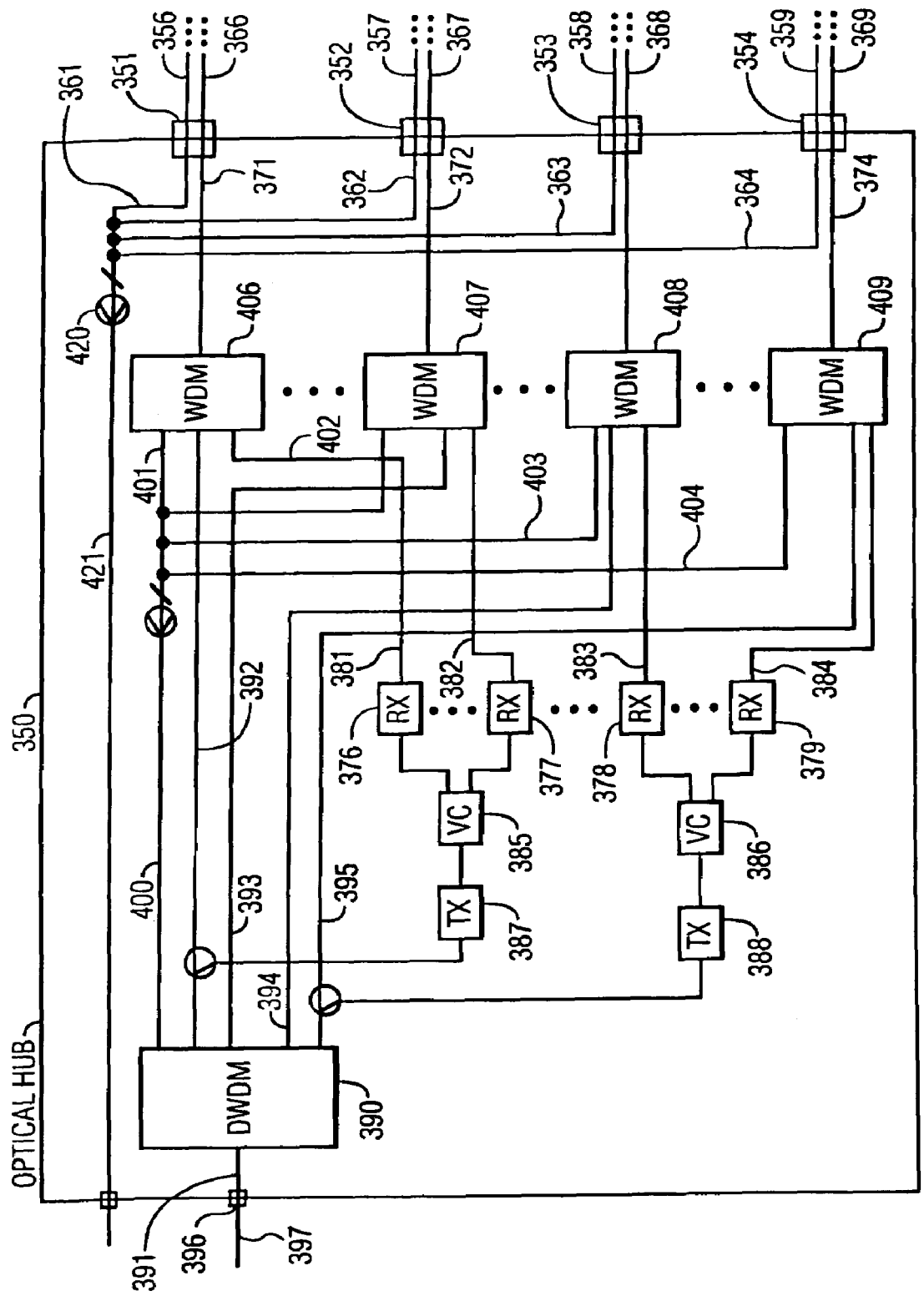
FIG. 9 illustrates portions of an optical hub of the invention.

FIG. 9 illustrates portions of an optical hub 350 of the invention, which includes: a multitude of connectors 351-354 for connecting respective optical fibers 356-359 for respective hybrid fiber coax nodes (HFCNs) to respective optical paths 361-364; and for connecting respective optical fibers 366-369 for respective HFCNs to respective optical paths 371-374. The optical hub also includes: a multitude of optical receivers 376-379 for converting first multi-carrier optical return signals in respective optical paths 381-384 into respective first multi-carrier electronic return signals, the first multi-carrier signals each includes a multitude of base-band signals modulating respective first carrier signals; one or more upconverters 385-386, each for converting two or more first multi-carrier return signals into a single second multi-carrier electronic return signal, the second mufti-carrier return signals each includes all the base-band signals of the respective two or more first return signals that were combined, the base-band signals modulating respective second carrier signals, the second carrier signals having radio frequencies substantially higher than the radio frequencies of the first carrier signals; and respective optical transmitters 387-388 for converting the second mufti-carrier electronic return signals into second mufti-carrier optical return signals in respective optical paths, the optical signals having optical wavelengths, the wavelengths of the optical signals from the transmitters being different from the wavelengths of optical Signals from other transmitters. The optical hub further includes a WDM 390 for combining the second multicarrier optical return signals into a common optical path 391 and for separating forward digital signals from the common optical path into first optical paths 392-393 for respective HFCNs. Connector 396 is connected to optical path 391 and is provided for connecting an optical fiber 397 between the optical hub and the head-end.

The optical hub further includes one or more first splitters for routing a forward optical signal for digital broadcast television from a single optical path 400 into similar portions of the forward optical signal in second optical paths 401-404 for respective HFCNs. The optical hub further includes a multitude of a wavelength division multiplexers 406-409 for respective HFCNs. Each multiplexer combining optical forward signals from one of the first separate optical paths 392-395 and one of the second optical paths 401-404 into one of the common optical paths 366-369 for a respective HFCN and for separating a return signal from the respective common optical path of paths 366-369 for the HFCN into a separate return optical path of paths 381-384 for a respective optical receiver. The wavelength of the return optical signal for an HFCN must be different than the wavelengths of the forward optical signals for that HFCN so that the respective WDM can separate the low frequency return optical signal from the forward optical signal from the head-end. The optical hub further includes one or more second splitters 420 for routing a forward optical signal for analog broadcast television from a single optical path 421 into similar portions for the forward signal in third optical paths 361-364 for respective HFCNs.

The up converters of the optical hub may be provided by one skilled in the art by connecting demodulators (not shown) with modulators (not shown).

The transmitters 387-388 of the optical hub are similar to the transmitter 220 of FIG. 6, and the receivers 376-379 of the optical hub are similar to the receiver 240 of FIG. 7. Thus, each transmitter and receiver of the optical hub includes an amplifier module similar to the amplifier module 120 of FIG. 2 which includes the all pass filter 100 of FIG. 1.

Figure 10:
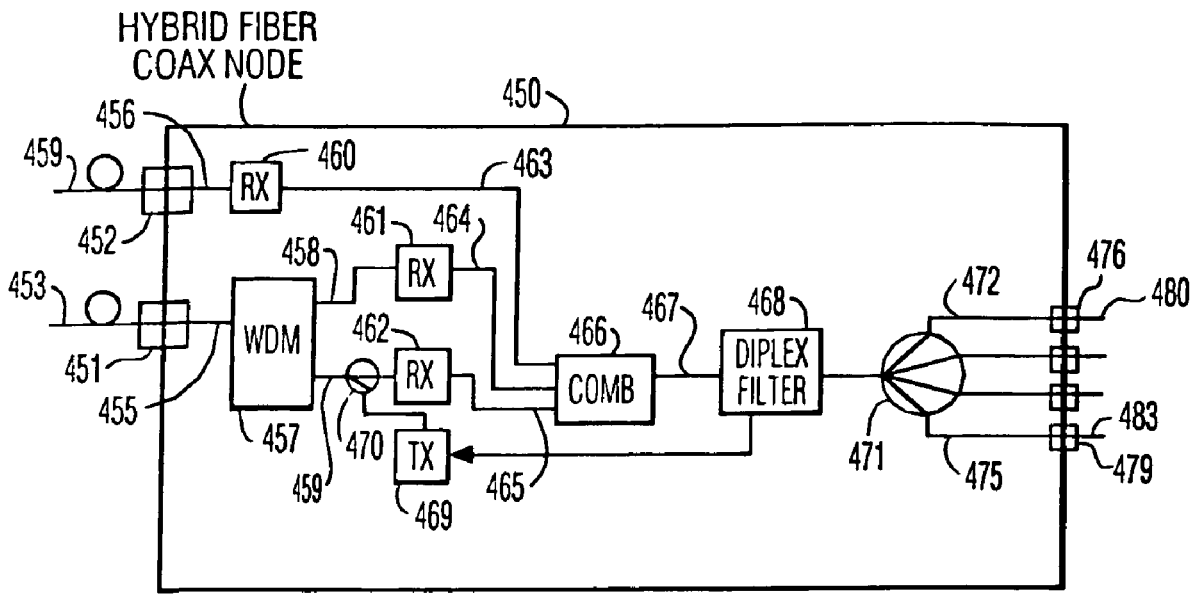
FIG. 10 illustrates portions of an HFCN of the invention.

FIG. 10 illustrates portions of an HFCN 450 of the invention, which includes: optical connectors 451-452 for connecting optical fibers 453-454 to respective optical paths 455-456; and a WDM 457 for separating forward signals in common path 455 into separate optical signals in respective paths 458 and 459 and routing a return signal in optical path 459 into common fiber 455. The HFCN also includes: optical receivers 460-462 for converting optical forward signals in the respective optical paths 456, 458,459 into a first electronic forward signals in an respective electrical paths 463-465; and combiner 466 combines the electrical signals in paths 463-465 into electrical path 467. The HFCN has: a diplex filter 468 for separating electronic return signals from the electronic forward signal in the electrical path; an optical transmitter 469 for converting the separated electronic return signals in electrical path 499 into optical return signals; and a splitter 470 for combining the return signals in optical path 459. The HFCN further includes an electronic splitter 471 for routing the electronic forward signals from electrical path 467 into electrical paths 472-475 and routing electronic return signals from electrical paths 472-475 into electrical path 467. Also, connectors 476-479 are provided to connect coaxial cables 480-483 to respective electrical paths 472-475. Note that in this case all the connected coaxial cables comprise a single coaxial cable network because all the cables share the same return channels.

The receivers 460-462 of the HFCN are similar to the receiver 240 of FIG. 7, and transmitter 469 of the HFCN is similar to the transmitter 220 of FIG. 6. Thus, each transmitter and receiver of the optical hub includes an amplifier module similar to the amplifier module 120 of FIG. 2 which includes the all pass filter 100 of FIG. 1.

Figure 11:
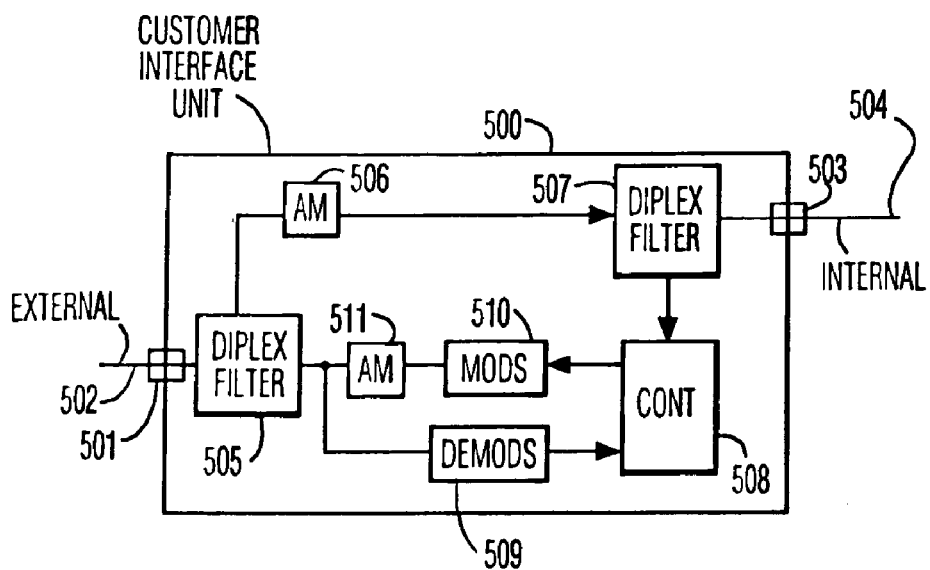
FIG. 11 illustrates portions of a customer interface unit (CIU) of the invention.

FIG. 11 illustrates portions of a customer interface unit (CIU) 500 of the invention which includes: a first connection 501 for an external coaxial cable network 502; a second connection 503 for an internal coaxial cable network 504; a first diplex filter 505 for separating the forward signals from the return signals in the external coaxial cable network; and a first amplifier module 506 for amplifying the forward signals to provide amplified forward signals into the internal coaxial cable network. The CIU further includes: a second diplex filter 507 for separating base-band return signals of the customer from the internal coaxial cable network; a controller 508 for controlling the transmission of the return signals from the customer; a demodulator 509 for providing control signals from the external coaxial cable network to the controller; a modulator 510 to modulate carrier signals with the base-band return signals to provide multi-carrier return signals from the customer; and a second amplifier module 511 for amplifying the multi-carrier return signals. The controller provides time division multiplexing of the return signals from the customer with return signals from other customer interface units connected to the same external coaxial cable network. The amplifier modules 506 and 511 are similar to the amplifier module 120 of FIG. 2 which includes the all pass filter 100 of FIG. 1.

Figure 12:
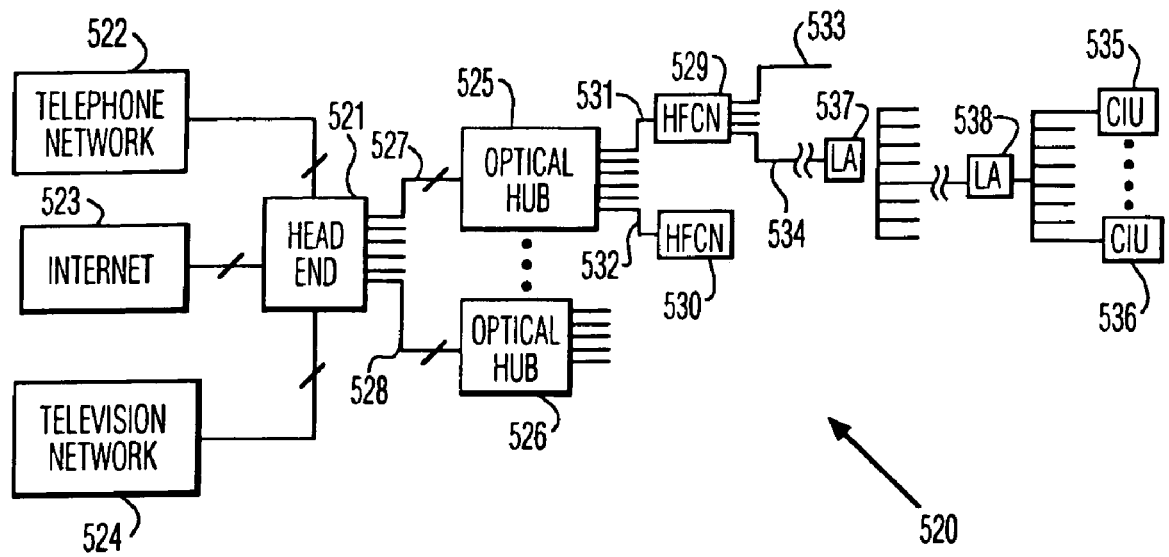
FIG. 12 shows a cable television system of the invention.

FIG. 12 shows a cable television system 520, which includes: a head-end 521; respective networks 522-524 connected to the-head-end; multiple optical hubs 525-526; respective common fibers 527-528 connected between the multiple optical hub and the head-end. The system further includes a respective multitude of HFCNs 529-530 for each optical hub; one or more optical fibers 531-532 connected between each HFCN and the respective optical hub for the HFCN; one or more coaxial cable networks 533-534 for each HFCN; a plurality of CIUs 535-536 connected to each coaxial cable network; and a plurality of line amplifiers 537-538 inserted into each coaxial cable network. The networks 522-524 include a telephone network 522, a computer network 523, and a television network 524. Each network provides bi-directional communication with the head-end to provide forward signals and receive return signals from the head-end. The head-end, optical hubs, and HFCNs contain optical receivers and optical transmitters which contain amplifier modules and the line amplifiers and customer interface units also include amplifier modules. The amplifier modules of the system of FIG. 12 are similar to the amplifier module 120 of FIG. 2 which includes the all pass filter 100 of FIG. 1.

Figure 13:
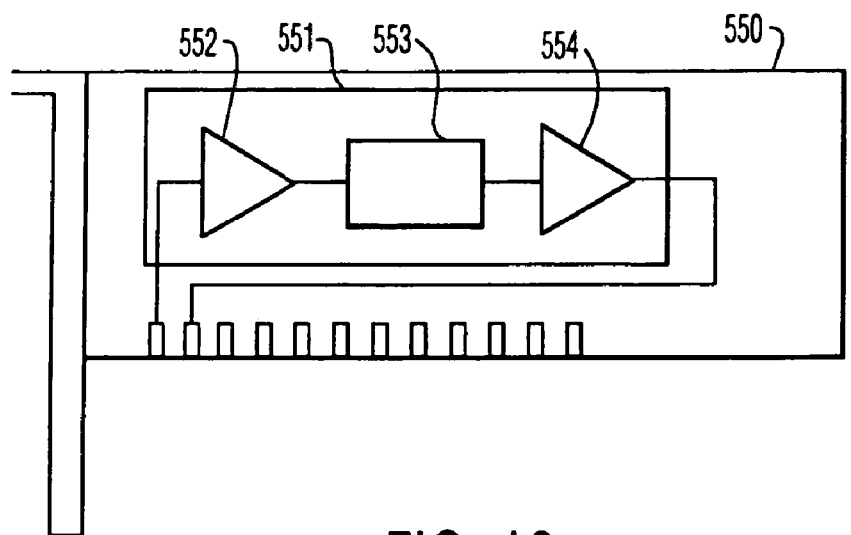
FIG. 13 illustrate portions of a plug-in card of the invention.

FIG. 13 illustrate portions of a plug-in card 550 of the invention containing an amplifier module 551 that is similar to amplifier module 120 of FIG. 2. The amplifier module 551 includes a first amplifier stage 552, a first phase filter 553 and a second amplifier stage 554. The phase filter 553 is similar to the phase filter 100 of FIG. 1.

Figure 14:
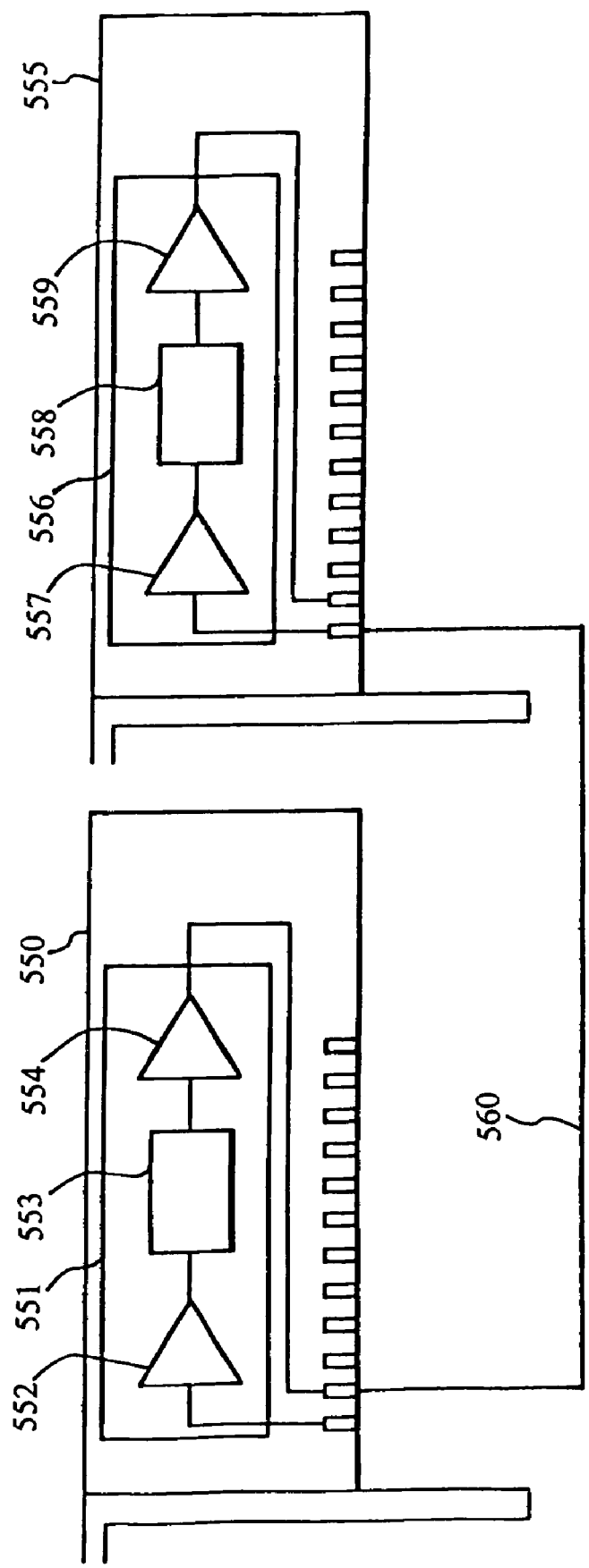
FIG. 14 illustrates two plug-in cards in accordance with a further aspect of the present invention.

FIG. 14 illustrates two plug-in cards 550 and 555. In FIG. 14, a second amplifier stage includes a first amplifier 554 and a second amplifier 557, which are respectively and separately positioned on plug-in cards 550 and 555. Plug-in cards 550 and 555 are arranged such that the output of first amplifier 554 is transmitted to the input of second amplifier 557. Plug-in card 555 also includes a second phase filter 558 and a third amplifier stage 559. Second phase filter 558 is similar to the phase filter 100 of FIG. 1.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

We claim:

1. An amplifier, comprising:
 a first amplifier configured to receive a wideband input signal having a carrier signal and output a first amplified signal, the first amplifier introducing first CTB distortions of the carrier signal into the first amplified signal;
 a first phase filter coupled to said first amplifier so as to receive said first amplified signal as an input, said first phase filter configured to output a first phase shifted signal;
 a second amplifier coupled to said first phase filter so as to receive said first phase shifted signal and to output a second amplified signal, the second amplifier introducing second CTB distortions of the carrier signal; and the first phase filter configured to shift a phase of the first amplified signal to an extent that substantially reduces accumulation of amplitudes of the CTB distortions produced by the first and second amplifiers while causing power of the CTB distortions produced by the first and second amplifiers to substantially accumulate.

2. The amplifier of claim 1, further comprising:

a second phase filter coupled to said second amplifier so as to receive said second amplified signal as an input, said second phase filter configured to output a second phase shifted signal;

a third amplifier coupled to said second phase filter so as to receive said second phase shifted signal and to output a third amplified signal, the third amplifier introducing third CTB distortions; and the first phase filter configured to shift a phase of the first amplified signal to an extent that substantially reduces accumulation of amplitudes of CTB distortions produced by the first, second, and third amplifiers while causing power of the CTB distortions produced by the first, second, and third amplifiers to substantially accumulate.

3. The amplifier of claim 2, further comprising:

the first and second phase filters configured to shift a phase of the first amplified signal and the second amplified signal, respectively, to extents that substantially reduce accumulation of amplitudes of CTB distortions produced by the first, second, and third amplifiers while causing power of the CTB distortions produced by the first, second, and third amplifiers to substantially accumulate.

4. The amplifier of claim 1, further comprising:

the phase shift of the first amplified signal between 15 and 60 degrees, and the phase shift of the second amplified signal between 15 and 60 degrees.

* * * * *